United States Patent
Chae et al.

(10) Patent No.: US 9,165,953 B2
(45) Date of Patent: Oct. 20, 2015

(54) FLAT PANEL DISPLAY DEVICE WITH OXIDE THIN FILM TRANSISTORS AND METHOD FOR FABRICATING THE SAME

(71) Applicant: LG Display Co., Ltd., Seoul (KR)

(72) Inventors: Ji Eun Chae, Gumi-si (KR); Tae Keun Lee, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/553,706

(22) Filed: Nov. 25, 2014

(65) Prior Publication Data

US 2015/0079732 A1    Mar. 19, 2015

Related U.S. Application Data

(62) Division of application No. 13/553,790, filed on Jul. 19, 2012, now Pat. No. 8,921,861.

(30) Foreign Application Priority Data

Sep. 2, 2011   (KR) .......... 10-2011-0089283
May 10, 2012  (KR) .......... 10-2012-0049742

(51) Int. Cl.
   *H01L 21/16*   (2006.01)
   *H01L 27/12*   (2006.01)
   *H01L 29/66*   (2006.01)

(52) U.S. Cl.
   CPC ........ *H01L 27/1259* (2013.01); *H01L 27/1225* (2013.01); *H01L 27/1244* (2013.01); *H01L 29/66969* (2013.01)

(58) Field of Classification Search
   CPC . H01L 27/1225; H01L 27/1244; H01L 27/32; H01L 21/02554; H01L 21/02565

USPC ............................................. 438/104; 257/59
See application file for complete search history.

(56) References Cited

U.S. PATENT DOCUMENTS

| 8,865,528 | B2 | 10/2014 | Song et al. |
| 2005/0263768 | A1 | 12/2005 | Ahn |
| 2007/0085965 | A1 | 4/2007 | Manabe |
| 2008/0303020 | A1 | 12/2008 | Shin et al. |
| 2009/0086136 | A1* | 4/2009 | Seo et al. ....................... 349/110 |

(Continued)

FOREIGN PATENT DOCUMENTS

| CN | 1702531 A | 11/2005 |
| CN | 102104049 A | 6/2011 |
| CN | 102104050 A | 6/2011 |

OTHER PUBLICATIONS

State Intellectual Property Office of the People's Republic of China, First Office Action, Chinese Patent Application No. 201210241872.8, Oct. 10, 2014, eight pages.

*Primary Examiner* — Long K Tran
(74) *Attorney, Agent, or Firm* — Fenwick & West LLP (57) ABSTRACT

A flat panel display device with oxide thin film transistors and a fabricating method thereof are disclosed. The flat panel display device includes: a substrate; gate lines and data lines formed to cross each other and define a plurality of pixel regions on the substrate; the thin film transistors each including an oxide channel layer which is formed at an intersection of the gate and data lines; a pixel electrode and a common electrode formed in the pixel region with having a passivation layer therebetween; and step coverage compensation patterns formed at a step portion formed by the gate line and a gate electrode of the thin film transistor.

6 Claims, 10 Drawing Sheets

(56) References Cited

U.S. PATENT DOCUMENTS

| | | |
|---|---|---|
| 2011/0012116 A1 | 1/2011 | Yamazaki et al. |
| 2011/0133193 A1* | 6/2011 | Song et al. .................. 257/59 |
| 2011/0147743 A1 | 6/2011 | Ahn et al. |
| 2011/0169005 A1* | 7/2011 | Saito et al. .................. 257/59 |
| 2011/0204370 A1 | 8/2011 | Yoon et al. |
| 2012/0052636 A1 | 3/2012 | Shin et al. |

* cited by examiner

FLAT PANEL DISPLAY DEVICE WITH OXIDE THIN FILM TRANSISTORS AND METHOD FOR FABRICATING THE SAME

CROSS-REFERENCE TO RELATED APPLICATIONS

This application is a divisional of U.S. patent application Ser. No. 13/553,790, titled "Flat Panel Display Device with Oxide Thin Film Transistors and Method for Fabricating the Same" and filed on Jul. 19, 2012, which claims priority under 35 U.S.C. 119(a) to Korean Patent Application No. 10-2011-0089283, filed on Sep. 2, 2011, and to Korean Patent Application No. 10-2012-0049742, filed on May 10, 2012, all of which are hereby incorporated by reference in their entirety.

BACKGROUND

1. Field of the Disclosure

This disclosure relates to a flat panel display device with oxide thin film transistors and a method for fabricating the same.

2. Description of the Related Art

Image display devices used for displaying a variety of information on a screen are one of the core technologies of the information and communication era. Such image display devices have been being developed to be thinner, lighter, and more portable, and furthermore to have a high performance. Actually, flat panel display devices are spotlighted in the display field due to their reduced weight and volume, well known disadvantages of cathode ray tubes (CRTs). The flat panel display devices include for example, OLED (organic light-emitting diode) devices which display images by controlling the light emitting quantity of an organic light emission layer.

The OLED devices are self-illuminating display devices employing a thin light emission layer between electrodes. As such, the OLED devices can become thinner like a paper. Such OLED devices display images by emitting light through an encapsulated substrate. The encapsulated substrate includes a plurality of pixels arranged in a matrix shape and each configured with 3 colored (i.e., red, green and blue) sub-pixels, a cell driver array, and an organic light emission array.

In order to realize a variety of colors, the OLED device employs organic light emission layers which are configured to emit red, green and blue lights, respectively. The organic light emission layer is interposed between two electrodes and used to form an organic light emission diode.

The OLED device requires a thin film transistor which can be driven faster. To this end, the OLED device uses an oxide film, such as an IGZO (indium gallium zinc oxide) film, instead of amorphous silicon film.

Figure 1:
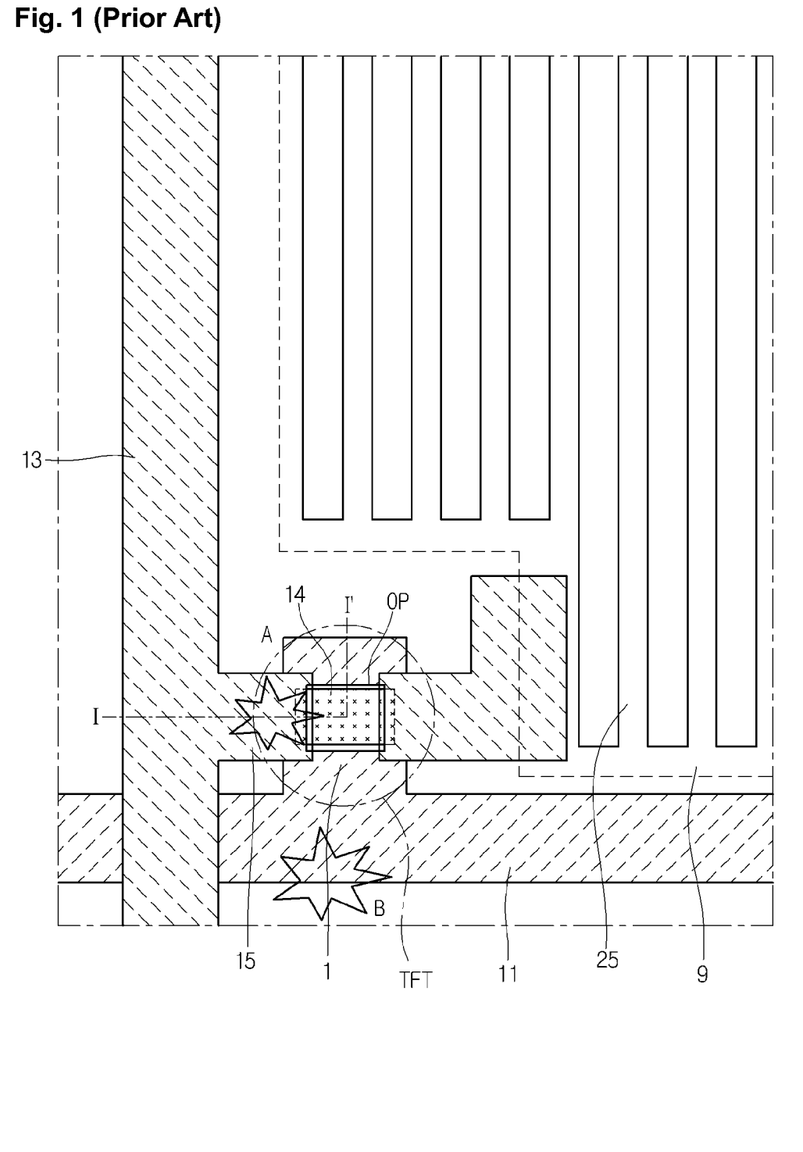
FIG. 1 is a planar view showing the structure of a pixel within a conventional flat panel display device.
Figure 2:
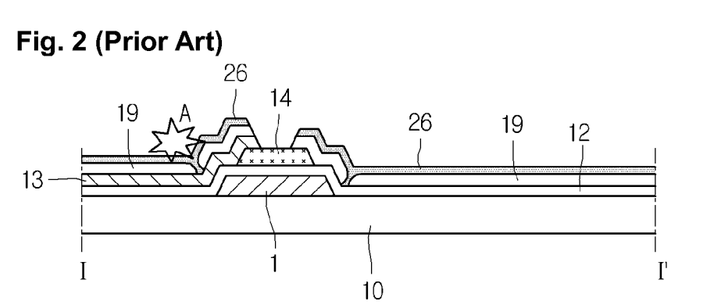
FIG. 2 is a cross-sectional view taken along a line I-I' in FIG. 1.

FIG. 1 is a planar view showing the structure of a pixel within a flat panel display device according to the related art. FIG. 2 is a cross-sectional view showing the pixel structure taken along a line I-I' in FIG. 1.

Referring to FIGS. 1 and 2, the flat panel display device of the related art includes a plurality of gate lines 11 and a plurality of data lines 13. The gate lines 11 and the data 13 crossing each other define a plurality of pixel regions. A pixel electrode 9 and a common electrode 25 are disposed within each of the pixel regions.

Also, a thin film transistor TFT is disposed at an intersection of the gate and data lines 11 and 13. The thin film transistor TFT includes a gate electrode 1, a gate insulation layer 12, a channel layer 14, a source electrode 15 and a drain electrode which are formed on a substrate 10. The drain electrode is directly connected to the pixel electrode 9 within the pixel region.

Moreover, in a structure that a common electrode 25 is formed over the pixel electrode, a common line 26 is formed on all regions except the pixel region and in a single body with the common electrode 25. In other words, the common line 26, which is formed in a single body united with the common electrode 25, overlaps with the thin film transistor TFT, the gate line 11 and the data line 13 within a non-display region. Meanwhile, an opening OP is formed by removing a part of the common line 26 opposite to the channel layer 14 of the thin film transistor TFT, in order to prevent the generation of a parasitic capacitance.

The thin film transistor used in a driver circuit of the flat panel display device such as an OLED device is required to have very high-speed response characteristics. As such, the channel layer 14 is formed from an oxide material, such as indium gallium zinc oxide IGZO, instead of amorphous silicon (a-Si:H).

When the channel layer 14 is formed from an oxide material, a $SiO_2$-based insulation film is used for the formation of the channel layer 14 in order to enhance characteristics of the channel layer 14. That is, if the channel layer 14 is formed from a material having oxide, an insulation layer such as a gate insulation layer or a passivation layer is formed of a $SiO_2$-based material, so as to enhance characteristics of the channel layer 14

However, the $SiO_2$-based insulation film has lower taper and interface characteristics compared to the $SiN_x$-based insulation film. Due to this, faults are often caused when the $SiO_2$-based insulation film is stacked. For example, the $SiO_2$-based insulation film has an un-uniform thickness or is disconnected in a step coverage region.

Such an un-uniform thickness or a disconnection in the step coverage region occurring in corners of the gate electrode 1 of the thin film transistor TFT and edges of the gate line 11 may cause a short circuit fault to be often generated in regions A and B.

In A-region of FIG. 1, for example, the gate line 11 and the gate electrode 1 each have a thickness of about 2000~2500 Å, the passivation layer 19 formed from a $SiO_2$-based material has a thickness of about 600~800 Å, and the pixel electrode 9 or the common electrode 25 has a thickness of about 400 Å.

Because the passivation layer 19 formed from the $SiO_2$-based material has a poor taper characteristic, a disconnection fault of the passivation layer 19 is generated in an edge of the gate electrode 1 crossing the source electrode 15. Due to this, the common line 26 formed over the thin film transistor TFT may be electrically shunted with the data line 13 or the source electrode 15, which is disposed under the common line 26.

Also, for example, a disconnection in the gate insulation layer 12, which is formed from a $SiO_2$-based material, may cause the gate electrode) and the gate line 11 to be electrically shunted with the source and drain electrodes, the data line 13 and the common line 26 which cross the gate electrode 1 and the gate line 11. Particularly, the gate electrode 1 and the gate line 11 become thicker than those of the insulation film and the other electrodes. As such, the gate insulation layer 12 formed from the $SiO_2$-based material is easily disconnected in the step coverage region.

BRIEF SUMMARY

Accordingly, the present embodiments are directed to a flat panel display device with an oxide thin film transistor that substantially obviates one or more of problems due to the limitations and disadvantages of the related art, and a method of fabricating the same.

An object of the present embodiments is to provide a flat panel display device with an oxide thin film transistor that is adapted to prevent disconnection and short-circuit faults of insulation films due to a step coverage, using step coverage compensation patterns which are formed at intersections of electrodes of the thin film transistor and another intersection of signal lines, i.e., gate and data lines, as well as a method of fabricating the same.

Another object of the present embodiments is to provide a flat panel display device with an oxide thin film transistor which is adapted to prevent a short circuit fault between electrodes of the thin film transistor or signal lines, such as gate and data lines, without an additional fabrication process, by simultaneously forming step coverage compensation patterns at an intersection of the electrodes and another intersection of the signal lines when an etch stopper is formed, as well as a method of fabricating the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a flat panel display device with an oxide thin film transistor includes: a substrate; gate lines and data lines formed to cross each other and define a plurality of pixel regions on the substrate; the thin film transistors each including an oxide channel layer which is formed at an intersection of the gate and data lines; a pixel electrode and a common electrode formed in the pixel region with having a passivation layer therebetween; and step coverage compensation patterns formed at a step portion formed by the gate line and a gate electrode of the thin film transistor.

Furthermore, in the above mentioned flat panel display device, the step portion may include at least one of intersections of gate electrode and source and drain electrodes included in each the thin film transistor, an intersection of the data line and the gate line, and an intersection of the drain electrode and the gate line.

Moreover, the above mentioned flat panel display device may further comprise an etch stopper formed on the oxide channel layer of the thin film transistor.

Further, in the above mentioned flat panel display device, the step coverage compensation patterns may be connected to the etch stopper by linkers.

Furthermore, in the above mentioned flat panel display device, the step coverage compensation patterns may be formed in a single body covering all regions corresponding to the gate electrode of the thin film transistor, the intersections of the gate electrode and the source and drain electrodes, the intersection of the data line and the gate line and the intersection of the drain electrode and the gate line.

Moreover, in the above mentioned flat panel display device, the oxide channel layer may be formed from indium gallium zinc oxide IGZO.

Further, in the above mentioned flat panel display device, the step coverage compensation pattern may be thicker than the etch stopper.

Furthermore, in the above mentioned flat panel display device, the step coverage compensation pattern may be in a thickness range of about 1200~1600 Å.

A method of fabricating a flat panel display device with an oxide thin film transistor according to another general aspect of the present embodiment includes: forming a gate electrode and a gate line, and the gate line and a data line which will be formed through the following process crossing each other and defining a pixel region on a substrate; forming a gate insulation layer on the substrate provided with the gate electrode and the gate line; forming a pixel electrode in the pixel region on the gate insulation layer; forming an oxide channel layer over the gate electrode, wherein the gate insulation layer is between the oxide channel layer and the gate electrode; forming an etch stopper on the oxide channel layer and step coverage compensation patterns at a step portion formed by the gate line and the gate electrode; forming the data line, and the source and drain electrodes which are contacted with the oxide channel layer on the substrate with the etch stopper and the step coverage compensation patterns; forming a passivation layer covering the substrate having the data line and the source and drain electrodes; and forming a common electrode on the passivation layer.

Furthermore, in the above mentioned method, the step portion may include at least one of intersections of gate electrode and source and drain electrodes included in each the thin film transistor, an intersection of the data line and the gate line, and an intersection of the drain electrode and the gate line Moreover, in the above mentioned method, the oxide channel layer may be formed from indium gallium zinc oxide IGZO.

Further, in the above mentioned method, the formation of the etch stopper and the step coverage compensation patterns may include: sequentially forming an insulation layer and a photo resist film on the substrate with the oxide channel layer; patterning the photo resist film into a first photo resist pattern and second photo resist patterns using one of a half-tone mask and a diffractive mask; performing a first etch process, which uses the first and second photo resist patterns as etch masks, for the insulation layer to form a first insulation layer pattern on the oxide channel layer together with second insulation layer patterns in the overlapping regions of the gate electrode and the source and drain electrodes which will be formed through the following process; performing a first asking process for the first and second photo resist patterns to expose the first insulation layer pattern, and remaining a third photo resist pattern on the second insulation layer pattern; performing a second etch process for the exposed first insulation layer pattern to form the etch stopper; and performing a second asking process for the third photo resist pattern to expose the second insulation layer pattern to form the step coverage compensation patterns, wherein the etch stopper and the step coverage compensation patterns may be in different thicknesses.

Furthermore, in the above mentioned method, the step coverage compensation pattern may be thicker than the etch stopper.

Moreover, in the above mentioned method, the step coverage compensation pattern may be in a thickness range of about 1200~1600 Å.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 3:
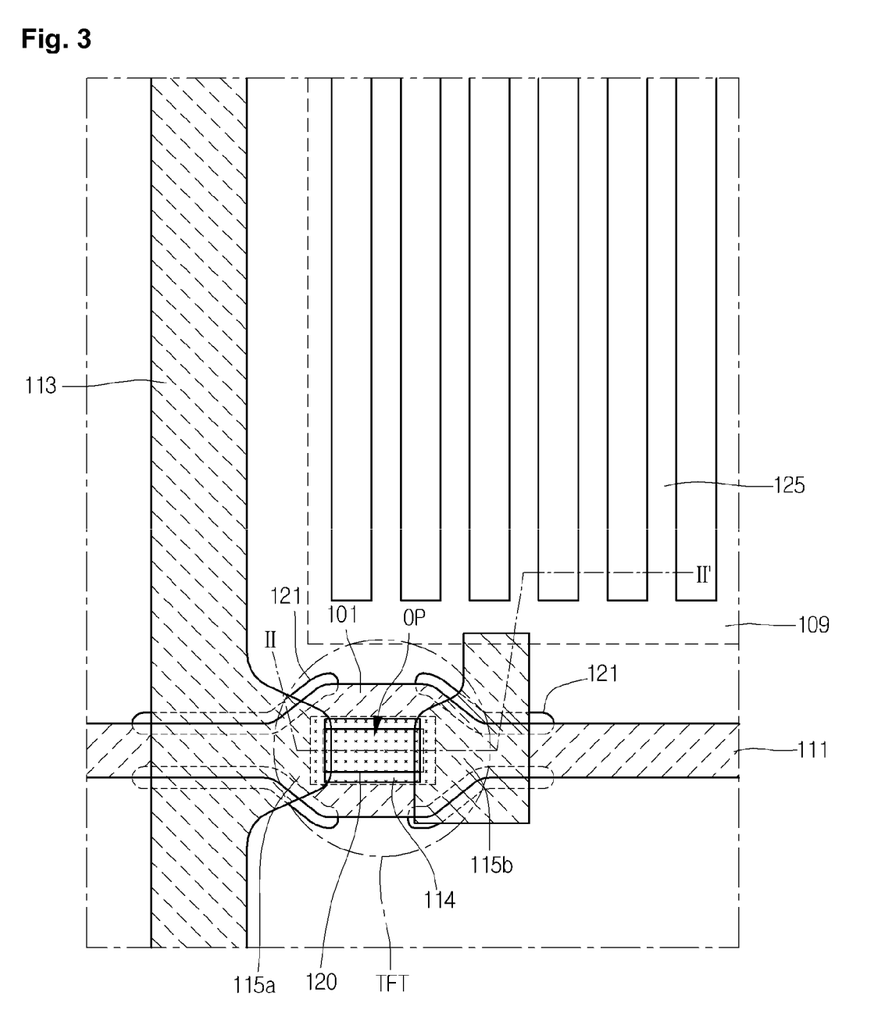
FIG. 3 is a planar view showing the structure of a pixel within a flat panel display device according to a first embodiment of the present disclosure.
Figure 4:
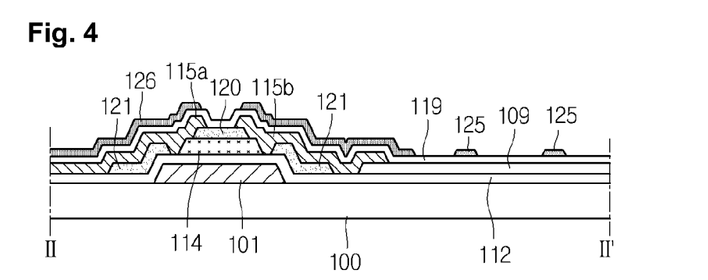
FIG. 4 is a cross-sectional view taken along a line II-II' in FIG. 3.

FIG. 3 is a planar view showing the structure of a pixel within a flat panel display device according to a first embodiment of the present disclosure. FIG. 4 is a cross-sectional view taken along a line II-II' in FIG. 3.

Referring to FIGS. 3 and 4, the flat panel display device with the oxide thin film transistor according to the first embodiment of the present disclosure can include a plurality of gate lines 111 and a plurality of data lines 113. The gate lines 111 and the data 113 crossing each other define a plurality of pixel regions. A pixel electrode 109 and a common electrode 125 are formed within each of the pixel regions.

The flat panel display device can further include a thin film transistor TFT disposed at an intersection of the gate and data lines 111 and 113. The thin film transistor TFT can include a gate electrode 101, a gate insulation layer 112, a channel layer 114, source and drain electrodes 115a and 115b and an etch stopper 120 which are formed on a substrate 100. The etch stopper 120 is formed on the channel layer 114 between the source and drain electrodes 115a and 115b facing each other. The drain electrode 115b is directly connected to the pixel electrode 109 which is formed on the gate insulation layer 112.

Also, the flat panel display device can include a passivation layer 119, a common electrode 125 and a common line 126. The passivation layer 119 is formed over the thin film transistor TFT. The common electrode 125 and the common line 126 are formed on the passivation layer 119 and in a single body united with each other. The common electrode 125 overlaps with the pixel electrode 109 within the pixel region. Moreover, the common electrode 125 is formed to include a plurality of bar electrodes which are separate from each other in a fixed interval.

The common line 126 formed in a single body united with the common electrode 125 is disposed in a non-display region in which the gate line 111, the data line 113 and the thin film transistor TFT are formed. An opening OP is formed by removing a part of the common line 126 opposite to the channel layer 114, in order to prevent the generation of a parasitic capacitance in a part of the non-display zone corresponding to the channel layer 114.

Particularly, the flat panel display device can include a plurality of step coverage compensation patterns 121 formed along the gate electrode 101 and the gate line 111. The step coverage compensation patterns 121 can be formed at at least one of an intersection of the gate electrode 101 and the source electrode 115a, an intersection of the gate electrode 101 and the drain electrode 115b, an intersection of the data line 113 and the gate line 111, and an intersection of the drain electrode 115b and the gate line 111.

As shown in FIG. 4, the step coverage compensation patterns 121 included in the flat panel display device of the present embodiment is simultaneously formed when an etch stopper 120 is formed. The step coverage compensation pattern 121 can be formed in a thickness range of 600~800 Å which is the same thickness as the etch stepper 120.

However, the step coverage compensation pattern 121 becomes twice as thick as the etch stopper 120 because the gate electrode 101 and the gate line 111 are thicker than other electrodes and lines. For example, the step coverage compensation pattern 121 can be formed in a thickness range of about 1200~1600 Å when the etch stopper 120 is in a thickness range of about 600~800 Å (as shown in FIG. 6A through 6D). As such, the step coverage compensation pattern 121 can compensate for the step coverage caused by the thicknesses of the gate electrode 101 and the gate line 111 corresponding to 2500 Å.

After the step coverage compensation is performed by the step coverage compensation patterns 121, the source and drain electrodes 115a and 115b and the data line 113 are formed. As such, any additional step coverage is not generated in the source and drain electrodes 115a and 115b and the data line 113 which cross the gate electrode 101 and the gate line 111.

Also, any disconnection fault of the passivation layer 119 is not generated in corners of the gate electrode 101 and edges of the gate line 111 (regions in which the step coverage compensation patterns are formed) even though the passivation layer 119 of a $SiO_2$-based material is formed on the substrate 100 provided with the source and drain electrodes 115a and 115b and the data line 113. This results from the fact that the step coverage compensation is already performed by the step coverage compensation patterns 121.

In accordance therewith, the short circuit fault, that the common line 126 formed on the passivation layer 119 is shunted with the source and drain electrodes 115a and 115b and the data line 113 due to the disconnection of the passivation layer 119, can be prevented.

A process of fabricating the flat panel display device according to a first embodiment of the present disclosure will now be described in detail.

First, a gate electrode 101 and a gate line 111 are provided by forming a metal film on a substrate 100 and performing a first masking procedure for the metal film. Then, a gate insulation layer 112 is formed on the substrate 100 provided with the gate electrode 101 and the gate line 111. The gate insulation layer 112 can be formed from one of a $SiO_2$-based insulation film and a $SiN_x$-based insulation film.

The gate electrode 101 and the gate line 111 can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the gate electrode 101 and the gate line 111 can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

When the gate electrode 101, the gate line 111 and the gate insulation layer 112 are formed as described above, a channel layer 114 can be formed on the gate insulation layer 112 opposite to the gate electrode 101. The channel layer 114 can be prepared by forming an oxide layer on the entire surface of the substrate 100 provided with the gate insulation layer 102 and patterning the oxide layer.

The oxide layer can be formed from an amorphous oxide which includes at least one of indium In, zinc Zn, gallium Ga, hafnium Hf and so on. For example, when an oxide semiconductor of Ga—In—Zn—O is formed through a sputtering process, targets each formed from $In_2O_2$, $Ga_2O_3$ and ZnO or a single target formed from Ga—In—Zn oxide can be used. Alternatively, when an oxide semiconductor of Hf—In—Zn—O is formed through a sputtering process, targets each formed from $HfO_2$, $In_2O_2$ and ZnO or a single target formed from Hf—In—Zn oxide can be used.

After the above-mentioned channel layer 114 is formed on the substrate 100, a pixel electrode 109 is formed within a pixel region. The pixel electrode 109 can be prepared by forming a transparent conductive material layer, such as indium-tin-oxide ITO, indium-zinc-oxide IZO and indium-tin-zinc-oxide ITZO, on the entire surface of the substrate 100 and performing a second masking procedure for the transparent conductive material layer.

Thereafter, an etch stopper 120 and step-coverage compensation patterns 121 are formed on the substrate 100 provided with the pixel electrode 109 and the channel layer 114. More specifically, the etch stopper 120 can be formed on the channel layer 114. The step-coverage compensation patterns 121 are formed at intersections that the gate electrode 101 and the gate line 111 intersect with source and drain electrodes 115a and 115b and a data line 113 which will be formed later. The etch stopper 120 and the step-coverage compensation patterns 121 can be prepared by forming an insulation layer on the entire surface of the substrate provided with the pixel electrode 109 and the channel layer 114 and performing a third masking procedure, which uses one of a half-tone mask and a diffraction mask, for the insulation layer.

At this time, for example, the insulation layer used to form the etch stopper 120 and the step coverage compensation pattern 121 may be formed in the same thickness as the step coverage compensation pattern 121 with of about 1200~1600 Å. Also, the third masking procedure using the half-tone mask or the diffraction mask allows the etch stopper 120 to become about half of the step coverage compensation pattern 121 in thickness. The process of forming the etch stopper and 120 and the step coverage compensation patterns 121 will be explained referring to FIGS. 6A through 6D later.

In this manner, the step coverage compensation patterns formed thicker compensate for the step coverage generated in the corners of the gate electrode 101 and the edges of the gate line 111. As such, the passivation layer 119 which is formed after the formation of the step coverage compensation patterns 121 does not disconnect in the corners of the gate electrode 101 and the edges of the gate line 111, i.e., the step coverage regions.

After forming the etch stopper 120 and the step-coverage compensation patterns 121, the source electrode 115a and the drain electrode 115b are formed at both ends of the channel layer 114 with having the etch stopper 120 therebetween. In accordance therewith, a thin film transistor can be completed. In the same time, a data line 113 is formed. The data line 113, and the source and drain electrodes 115a and 115b can be prepared by forming a metal film on the entire surface of the substrate 100 provided with the etch stopper 120 and the step-coverage compensation patterns 121 and performing a fourth masking procedure for the metal film.

As shown in the drawings, the step coverage compensation patterns 121 formed at the intersections of the gate electrode 101 and the source and drain electrodes 115a and 115b become thicker than that of the etch stopper 120. Therefore, any step coverage is not generated in the source and drain electrodes 115a and 115b.

The source and drain metal film can be formed from an opaque conductive material with a low resistance. As an example of the opaque conductive material, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the source and drain metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

After the above-mentioned data line 113, source and drain electrodes 115a and 115b are formed on the substrate 100, a passivation layer 119 of a $SiO_2$-based material is formed on the entire surface of the substrate 100. Subsequently, a common electrode 125 and a common line 126 are provided by forming a transparent conductive material layer, such as ITO, ITZO and IZO, on the passivation layer 119 and performing a fifth masking procedure for the transparent conductive material layer. At the same time, the transparent conductive material layer over the channel layer 114 of the thin film transistor is etched, thereby forming an opening.

As shown in the drawings, the flat panel display device of the first embodiment includes the passivation layer 119 with a poor taper characteristic. However, the step coverage compensation patterns 121 are formed in the step coverage region of the gate electrode 101 and the gate line 111 so that a repetitional step coverage is not generated in the source and drain electrodes 115a and 115b which are formed the formation of the step coverage compensation patterns 121. Therefore, the disconnection of the passivation layer 119 can be prevented.

Meanwhile, the related art causes the step coverage to be generated in the corners of the gate electrode and the edges of the gate line. Moreover, the step coverage is repetitionally generated in the source and drain electrodes and the data line which cross the gate electrode and the gate line. Due to this, the passivation layer formed through the following process is disconnected in the step coverage regions. However, the flat panel display device of the first embodiment can prevent the disconnection of the passivation layer using the step coverage compensation film.

Figure 5A:
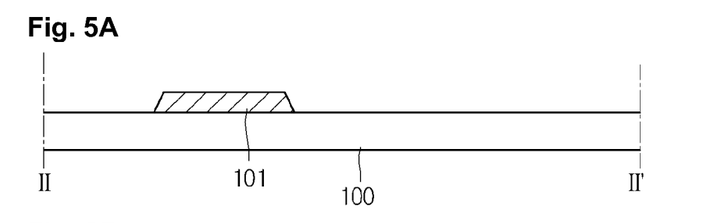
FIGS. 5A through 5E are cross-sectional views illustrating a method of fabricating a flat panel display device according to a first embodiment of the present disclosure.
Figure 5B:
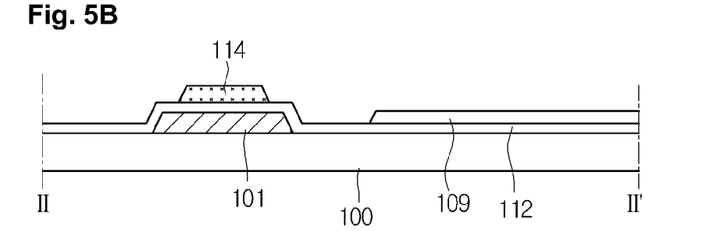
Figure 5C:
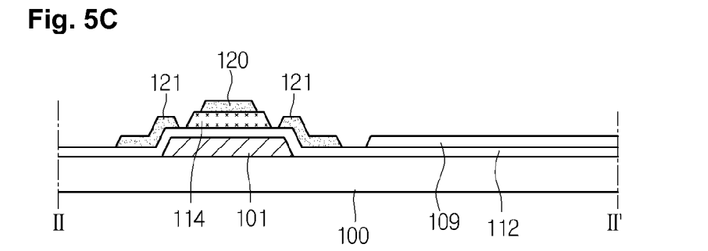

FIGS. 5A through 5C are cross-sectional views illustrating a method of fabricating a flat panel display device according to an embodiment of the present disclosure.

Referring to FIGS. 3 and 5A through 5E, gate electrode 101 is provided by forming a metal film on a substrate 100 and performing a first photolithography masking procedure for the metal film. Then, a gate insulation layer 112 is formed on the substrate 100 provided with the gate electrode 101. The gate insulation layer 112 can be formed from one of a $SiO_2$-based insulation film and a $SiN_x$-based insulation film. A gate line 111 is simultaneously formed at the formation of the gate electrode 101.

The gate electrode 101 can be formed from an opaque conductive material with a low resistance. As an example of the opaque conductive material with the low resistance, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the gate electrode 101 can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

When the gate electrode 101 and the gate insulation layer 112 are formed as described above, a channel layer 114 can be formed on the gate insulation layer 112 opposite to the gate electrode 101. The channel layer 114 can be prepared by forming an oxide layer on the entire surface of the substrate 100 provided with the gate insulation layer 112 and patterning the oxide layer.

The oxide layer can be formed from an amorphous oxide which includes at least one of indium In, zinc Zn, gallium Ga, hafnium Hf and so on. For example, when an oxide semiconductor of Ga—In—Zn—O is formed through a sputtering process, targets each formed from $In_2O_3$, $Ga_2O_3$ and ZnO or a single target formed from Ga—In—Zn oxide can be used. Alternatively, when an oxide semiconductor of Hf—In—Zn—O is formed through a sputtering process, targets each formed from $HfO_2$, $In_2O_2$ and ZnO or a single target formed from Hf—In—Zn oxide can be used.

After the above-mentioned channel layer 114 is formed on the substrate 100, a pixel electrode 109 is formed within a pixel region. The pixel electrode 109 can be prepared by forming a transparent conductive material layer, such as indium-tin-oxide ITO, indium-zinc-oxide IZO and indium-tin-zinc-oxide ITZO, on the entire surface of the substrate 100 and performing a second photolithography masking procedure for the transparent conductive material layer. Such a pixel electrode 109 can be formed at the formation of the channel layer 114.

Thereafter, an etch stopper 120 is formed on the channel layer 114. The etch stopper 120 can be prepared by forming an insulation layer on the entire surface of the substrate provided with the pixel electrode 109 and the channel layer 114 and performing a third photolithography masking procedure for the insulation layer. Step-coverage compensation patterns 121 are simultaneously formed at the formation of the etch stopper 120. The step-coverage compensation patterns 121 are formed at intersections that the gate electrode 101 and the gate line 111 intersect with source and drain electrodes 115a and 115b and a data line 113 which will be formed later. The etch stopper 120 can be formed in the same thickness as the step-coverage compensation pattern 121.

However, in case the step coverage with a large step height is caused by the gate line 111 and the gate electrode 101, the third photolithography masking procedure can be performed using a half-tone mask or a diffraction mask. As such, the step-coverage compensation patterns 121 formed at intersections that the gate electrode 101 and the gate line 111 intersect with source and drain electrodes 115a and 115b and a data line 113, which will be formed later, can become thicker than the etch stopper 120 formed on the channel layer 114. The process of forming the etch stopper 120 and the step-coverage compensation patterns 121 in difference thicknesses from each other will be explained referring to FIGS. 6A through 6D later.

Figure 5D:
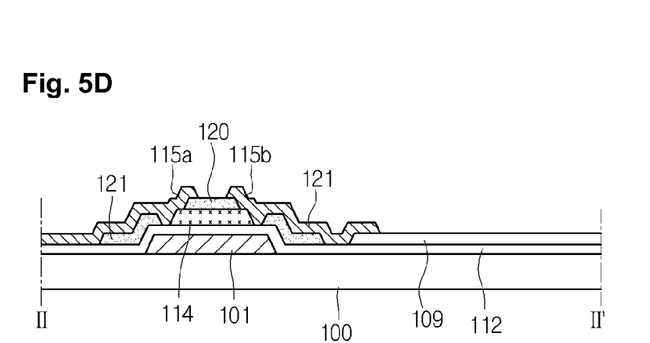

After the etch stopper 120 and the step-coverage compensation patterns 121 are formed on the substrate 100 as described above, the source/drain electrodes 115a and 115b and the data line 113 are prepared by forming a source/drain metal film on the entire surface of the substrate 100 and performing a fourth masking procedure for the source/drain metal film, as shown in FIG. 5D.

As shown in the drawings, the step coverage compensation patterns 121 are formed at the intersections of the gate electrode 101 and the source and drain electrodes 115a and 115b. Therefore, any step coverage is not generated in the source and drain electrodes 115a and 115b.

The source and drain metal film can be formed from an opaque conductive material with a low resistance. As an example of the opaque conductive material, one material selected from a group which includes aluminum Al, an aluminum alloy, tungsten W, copper Cu, nickel Ni, chromium Cr, molybdenum Mo, titanium Ti, platinum Pt, tantalum Ta and so on, can be employed. Alternatively, the source and drain metal film can be formed in a multi layer structure in which at least one transparent conductive material film and at least one opaque conductive material film are stacked. In this case, as an example of the transparent conductive material, indium-tin-oxide ITO, indium-zinc-oxide IZO or others can be employed.

The source/drain electrodes 115a and 115b are formed on the step-coverage compensation patterns 121 in such a manner as to cover both ends of the channel layer 114 and the etch stopper 120. Also, the drain electrode 115b comes in direct contact with the pixel electrode 109.

Figure 5E:
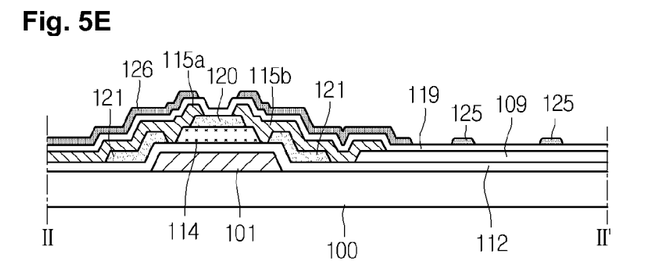

When the above-mentioned source/drain electrodes 115a and 115b are formed on the substrate 100, a passivation layer 119 of a $SiO_2$-based material is formed on the entire surface of the substrate 100 as shown in FIG. 5E. Subsequently, a common electrode 125 and a common line 126 are provided by forming a transparent conductive material layer, such as ITO, ITZO and IZO, on the passivation layer 119 and performing a fifth photolithography masking procedure for the transparent conductive material layer. At the same time, the transparent conductive material layer over the channel layer 114 of the thin film transistor is etched, thereby forming an opening.

In this way, the present embodiment allows the step coverages generated in corners of the gate electrode 101 and edges of the gate line 111 to be compensated by the step-coverage compensation patterns 121. In accordance therewith, the disconnection of the passivation layer 119 in corners of the gate electrode 101 and edges of the gate line 111 can be prevented.

More specifically, the flat panel display device of the first embodiment includes the passivation layer 119 with a poor taper characteristic. However, the step coverage compensation patterns 121 are formed in the step coverage region of the gate electrode 101 and the gate line 111 so that a repetitional step coverage is not generated in the source and drain electrodes 115a and 115b which are formed the formation of the step coverage compensation patterns 121. Therefore, the disconnection of the passivation layer 119 can be prevented.

In other words, the related art causes the step coverage be generated in the corners of the gate electrode and the edges of the gate line. Moreover, the step coverage is repetitionally generated in the source and drain electrodes and the data line which cross the gate electrode and the gate line. Due to this, the passivation layer formed through the following process is disconnected in the step coverage regions. However, the flat panel display device of the first embodiment can prevent the disconnection of the passivation layer using the step coverage compensation patterns.

FIGS. 6A through 6D are cross-sectional views illustrating fabricating a flat panel display device according to a second embodiment of the present disclosure.

Referring to FIGS. 3 and 6A through 6D, a gate electrode 101, a gate insulation layer 112 and a channel layer 114 are sequentially formed on the substrate 100. Subsequently, an insulation layer 130 with a thickness range of about 1200~1600 Å is formed on the entire surface of the above-mentioned substrate 100. The insulation layer 130 can be formed from an insulation material such as a SiNx-based material or a $SiO_2$-based material.

Figure 6A:
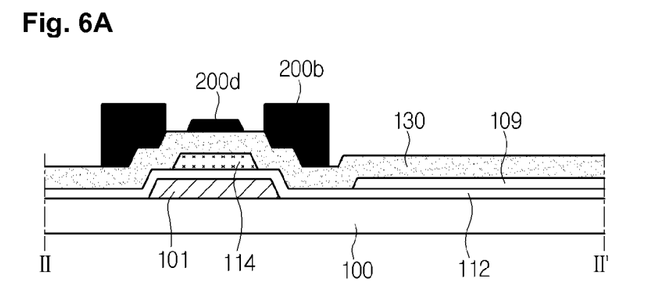
FIGS. 6A through 6D are cross-sectional views illustrating a method of fabricating a flat panel display device according to a second embodiment of the present disclosure.

When the insulation layer 130 is formed on the substrate 100, a photo resist film is formed on the insulation layer 130 and patterned into a first photo resist pattern 200d and second patterns 200b by performing an exposure process using one of a half-tone mask and a diffractive mask and a development process for the photo resist film. The first and second photo resist patterns 200d and 200b may have thicknesses different from each other.

Thereafter, a first etch process using the first and second photo resist patterns as an etch mask is performed for the insulation layer 130 to form a first insulation layer pattern 130a and second insulation layer patterns 130b. Subsequently, an asking process is performed for the first and second photo resist patterns 200d and 200b. As such, third photo resist patterns 200c remain on the second insulation layer patterns 130b. Meanwhile, the first insulation layer pattern 130a is externally exposed.

Figure 6B:
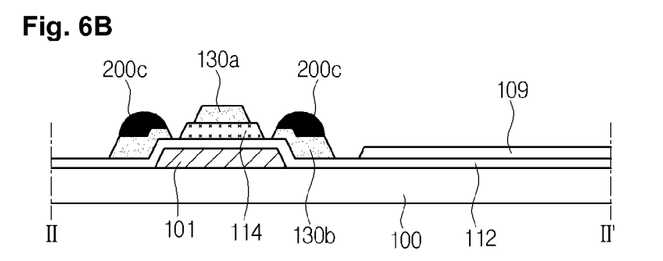

After the formation of the first insulation layer pattern 130a and the second insulation layer patterns 130b, a second etch process is performed for the first insulation layer pattern 130a which is exposed by the third photo resist patterns 200c, as shown in FIG. 6B. As such, the first insulation layer pattern 130a is reformed into an etch stopper 120 with for example a thickness range of about 600~800 Å. Also, the third photo resist patterns 200c are removed through a second asking process and expose the second insulation layer patterns 130b. The second insulation layer patterns 130b are used as step coverage compensation patterns 121a. These step coverage compensation patterns 121a are formed in corners of the gate electrode 101. Also, the step coverage compensation patterns 121a are also formed in edges of the gate line 111 in such a manner as to have the same shape as those in the corners of the gate electrode 101.

Figure 6C:
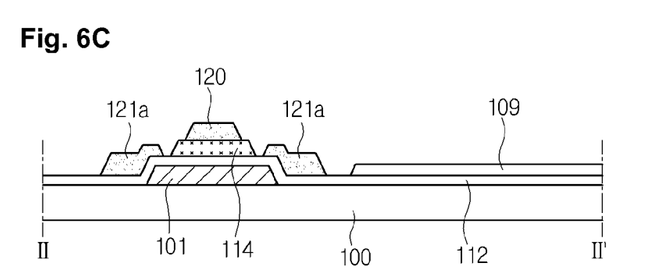

In this way, the present embodiment allows the step coverage compensation patterns 121a and the etch stopper 120 to be formed using the same masking procedure, but the step coverage compensation pattern 121a may be thicker than the etch stopper 120. For example, the step coverage compensation pattern 121a becomes twice as thick as the etch stopper 120. As such, the step coverage compensation patterns can compensate for the step coverage generated at the corners of the thick gate electrode 101 or the edges of the gate line 111.

Figure 6D:
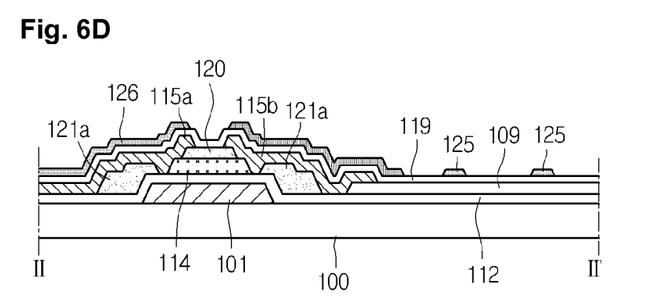

Afterward, as shown in FIG. 6D, the source/drain electrodes 115a and 115b and the data line 113 are prepared by forming a source/drain metal film on the entire surface of the substrate 100 and performing a photolithography masking procedure for the source/drain metal film.

As shown in the drawings, the step coverage compensation patterns 121a are formed at the intersections of the gate electrode 101 and the source and drain electrodes 115a and 115b. Therefore, any step coverage is not generated in the source and drain electrodes 115a and 115b.

The source/drain electrodes 115a and 115b are formed on the step-coverage compensation patterns 121a in such a manner as to cover both ends of the channel layer 114 and the etch stopper 120. Also, the drain electrode 115b comes in direct contact with the pixel electrode 109.

When the above-mentioned source/drain electrodes 115a and 115b are formed on the substrate 100, a passivation layer 119 of a $SiO_2$-based material is formed on the entire surface of the substrate 100. Subsequently, a common electrode 125 and a common line 126 are provided by forming a transparent conductive material layer, such as ITO, ITZO and IZO, on the passivation layer 119 and performing another photolithography masking procedure for the transparent conductive material layer. At the same time, the transparent conductive material layer over the channel layer 114 of the thin film transistor is etched, thereby forming an opening.

The second embodiment of the present disclosure can prevent disconnection and short-circuit faults of insulation films due to the step coverage, because the step coverage compensation patterns are formed at an intersection of electrodes of the thin film transistor and another intersection of signal lines, i.e., gate and data lines.

Also, the second embodiment of the present disclosure can prevent disconnection and short-circuit faults between the electrodes of the thin film transistor or the signal lines without an additional fabrication process, because the step coverage compensation patterns are formed at an intersection of electrodes of the thin film transistor and another intersection of signal lines, i.e., gate and data lines, when the etch stopper is formed.

Figure 7A:
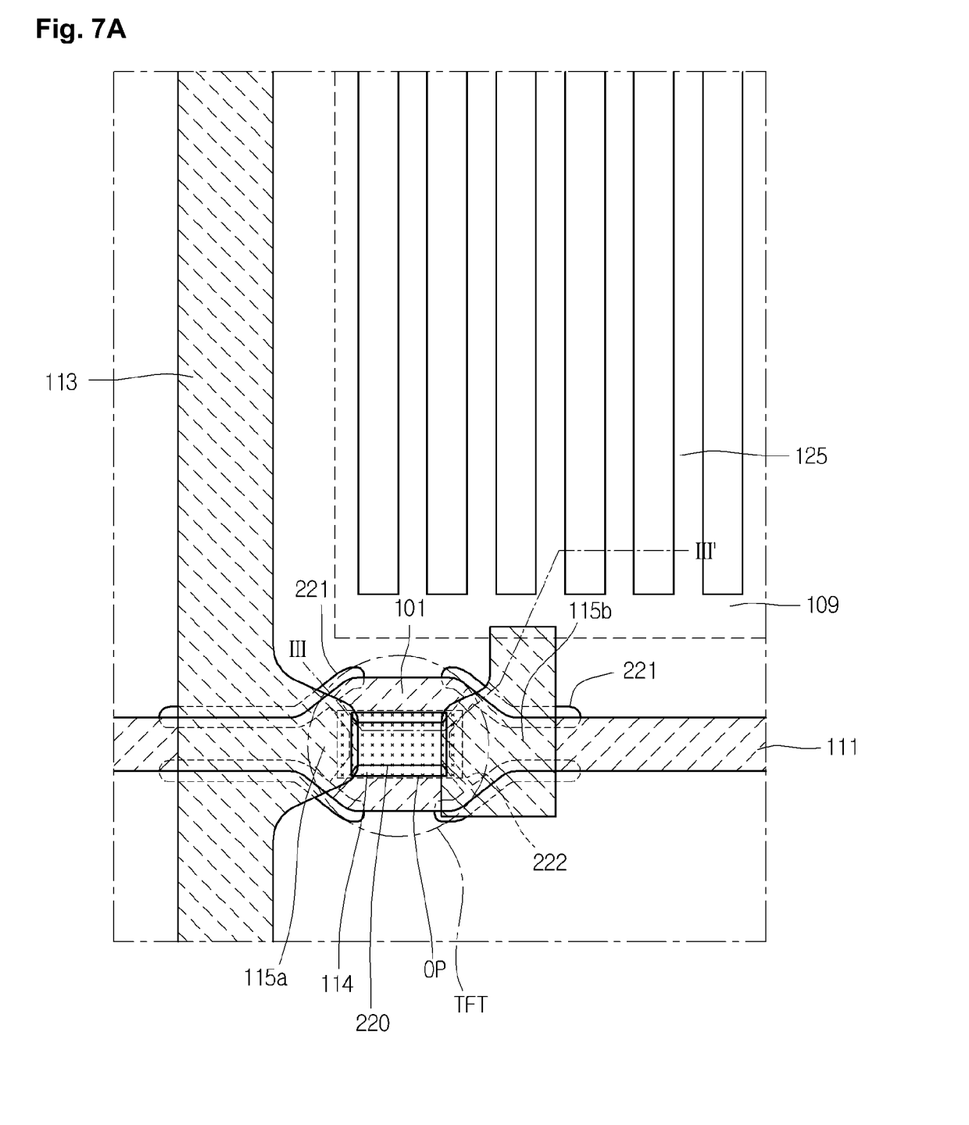
FIG. 7A is a planar view showing the structure of a pixel within a flat panel display device according to a third embodiment of the present disclosure.
Figure 7B:
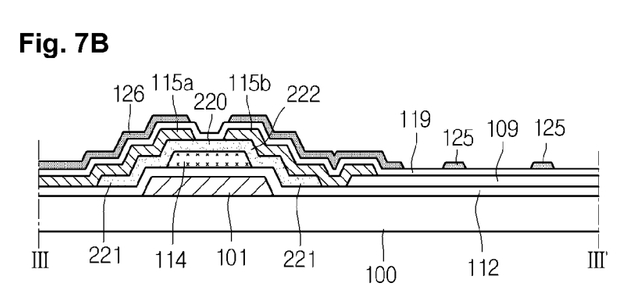
FIG. 7B is a cross-sectional view taken along a line III-III' of FIG. 7A.

FIG. 7A is a planar view showing the structure of a pixel within the flat panel display device according to a third embodiment of the present disclosure. FIG. 7B is a cross-sectional view taken along a line III-III' of FIG. 7A.

In FIGS. 7A and 7B, components referred to the same structure as those in FIGS. 3 and 4 are formed in the same structure as those in the FIGS. 3 and 4. As such, the components of FIGS. 7A and 7B, which are distinguished from those in the FIGS. 3 and 4, will be mainly explained.

Referring to FIGS. 3, 7A and 7B, the flat panel display device of the third embodiment can include step coverage compensation patterns 221, which are formed at at least one of an intersection of the gate electrode 101 and the source electrode 115a, an intersection of the gate electrode 101 and the drain electrode 115b, an intersection of the gate line 111 and the data line 113, and an intersection of the drain electrode 115b and the gate line 111, like that of the first embodiment.

However, the flat panel display device of the third embodiment can further include linkers 222 used for connecting the etch stopper 220 with the step coverage compensation patterns 221, unlike that of the first embodiment. The etch stopper 220, the step coverage compensation patterns 221 and the linkers 222 can be formed from the same material.

The linkers 222 are preferably formed at a corner of the source electrode 115a overlapping with the gate electrode 101 and a corner of the drain electrode 115b overlapping with the gate electrode 101.

Also, the linkers 222 can be formed in the same thickness as the etch stopper because the linkers 222 are arranged in an overlapping regions with the gate electrode 101.

In other words, the third embodiment of the present disclosure can enable the linkers 222 and the step-coverage compensation patterns 221 to be formed in the same thickness as the etch stopper 220, as shown in FIG. 7B. Alternatively, the step coverage compensation pattern 221 can be formed about twice as thick as the etch stopper 220 and the linkers 221, like that of the second embodiment of the present disclosure.

More specifically, a serious step coverage is not generated on the gate electrode 101 and the gate line 111. As such, the linker 222 are thinly formed like the etch stopper 220. Meanwhile, the step coverage compensation patterns 221 arranged in the step coverage regions caused by corners of the gate electrode 101 and edges of the gate line 111 are thickly formed.

Such thicknesses of the step coverage compensation pattern 221, the etch stopper 220 and the linkers 222 can be adjusted by modifying the half-tone mask or the diffractive mask which is used for the fourth masking procedure described in the second embodiment.

Therefore, the third embodiment of the present disclosure can prevent disconnection and short-circuit faults of insulation films due to the step coverage, because the step coverage compensation patterns are formed at an intersection of electrodes of the thin film transistor and another intersection of signal lines, i.e., gate and data lines.

Also, the third embodiment of the present disclosure can prevent disconnection and short-circuit faults between the electrodes of the thin film transistor or the signal lines without an additional fabrication process, because the step coverage compensation patterns are formed at an intersection of electrodes of the thin film transistor and another intersection of signal lines, i.e., gate and data lines, when the etch stopper is formed.

Figure 8A:
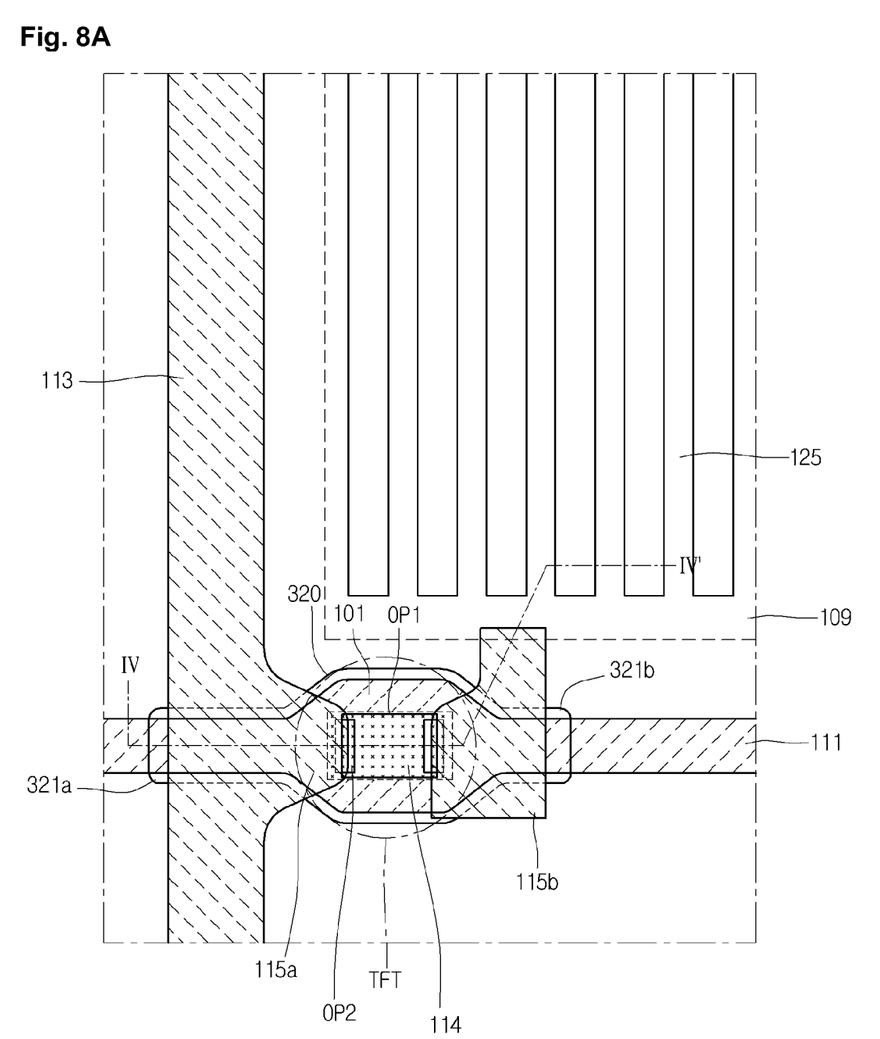
FIG. 8A is a planar view showing the structure of a pixel within a flat panel display device according to a fourth embodiment of the present disclosure.
Figure 8B:
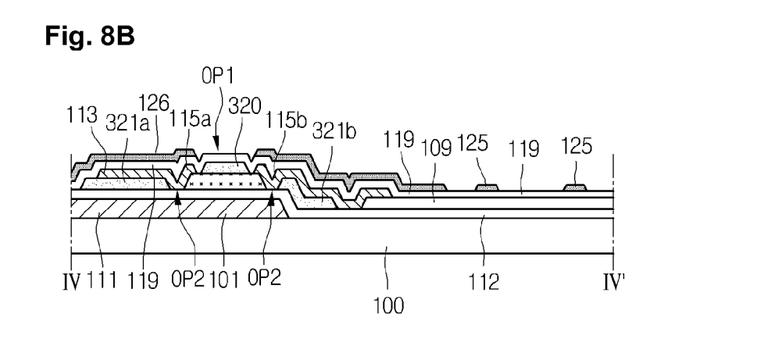
FIG. 8B is a cross-sectional view taken along a line IV-IV' of FIG. 8A.

FIG. 8A is a planar view showing the structure of a pixel within the flat panel display device according to a fourth embodiment of the present disclosure. FIG. 8B is a cross-sectional view taken along a line IV-IV' of FIG. 8A.

In FIGS. 8A and 8B, components referred to the same structure as those in FIGS. 3 and 4 are formed in the same structure as those in the FIGS. 3 and 4. As such, the components of FIGS. 8A and 8B, which are distinguished from those in the FIGS. 3 and 4, will be mainly explained.

Referring to FIGS. 3, 8A and 8B, the flat panel display device of the fourth embodiment can include a step coverage compensation patterns 320, which is formed at all regions which each correspond to the gate electrode of the thin film transistor TFT, an intersection of the gate line 111 and the data line 113 and another intersection of the drain electrode 115a and the gate line 111, unlike those of the first, second and third embodiments. As such, the step coverage compensation pattern 320 can include a first wing 321a formed to extend to the intersection of the data line 113 and the gate line 111, and a second wing 321b formed to extend to the intersection of the drain electrode 115b and the gate line 111.

Moreover, in the flat panel display device of the fourth embodiment, a first opening OP1 is be formed by removing a part of the common line 126, and second openings OP2 are formed by partially removing the step coverage compensation pattern 320, unlike that of the first embodiment. The second openings OP2 are used for the electrical connection between the source and drain electrodes 115a and 115b with the channel layer 114.

In other words, in the flat panel display device of the fourth embodiment, the overlapping region of the step coverage compensation pattern 320 with the channel layer 114 of the thin film transistor TFT functions as an etch stopper. As such, the second openings OP2 are formed by partially removing the step coverage compensation pattern 320, unlike the first opening OP1.

In accordance therewith, the source and drain electrodes 115a and 115b can contact the channel layer 114 through the second openings OP2 which are formed by partially removing the step coverage compensation pattern 320.

The step-coverage compensation pattern 320 is formed in the same thickness as the first and second wings 321a and 321b.

However, such a step coverage compensation pattern 320 can have different thicknesses from each other, like that of the second embodiment. For example, a part of the step coverage compensation pattern 320 overlapping with the gate electrode 101 and the gate line 111 can be in a thickness range of about 600~800 Å, the rest of the step coverage compensation pattern 320 positioned at step coverage regions corresponding to edges of the gate electrode 101 and the gate line 111 can be formed to have a thickness range of about 1200~1600 Å.

In other words, the step coverage compensation pattern 320 and the first and second wings 321a and 321b, which overlap with the gate electrode 101 and the gate line 111, become about half of the step coverage compensation pattern 320 and the first and second wings 321a and 321b, which do not overlap with the gate electrode 101 and the gate line 111, in thickness.

Therefore, the fourth embodiment of the present disclosure can prevent disconnection and short-circuit faults of insulation films due to the step coverage, because the step coverage compensation patterns are formed at an intersection of electrodes of the thin film transistor and another intersection of signal lines, i.e., gate and data lines.

Also, the fourth embodiment of the present disclosure can prevent disconnection and short-circuit faults between the electrodes of the thin film transistor or the signal lines without an additional fabrication process, because the step coverage compensation patterns are formed at an intersection of electrodes of the thin film transistor and another intersection of signal lines, i.e., gate and data lines, when the etch stopper is formed.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of fabricating a flat panel display device with oxide thin film transistors, the method comprising:
   forming a gate electrode and a gate line, and the gate line and a data line which will be formed through the following process crossing each other and defining a pixel region on a substrate;
   forming a gate insulation layer on the substrate provided with the gate electrode and the gate line;
   forming a pixel electrode in the pixel region on the gate insulation layer;
   forming an oxide channel layer over the gate electrode, wherein the gate insulation layer is between the oxide channel layer and the gate electrode;
   forming an insulating etch stopper on the oxide channel layer and step coverage compensation patterns at a step portion formed by the gate line and the gate electrode, the step coverage compensation patterns formed in a same layer as the insulating etch stopper;
   forming the data line, and the source and drain electrodes which are contacted with the oxide channel layer on the substrate with the insulating etch stopper and the step coverage compensation patterns;
   forming a passivation layer covering the substrate having the data line and the source and drain electrodes; and
   forming a common electrode on the passivation layer.

2. The method of claim 1, wherein the step portion includes at least one of intersections of gate electrode and source and drain electrodes included in each the thin film transistor, an intersection of the data line and the gate line, and an intersection of the drain electrode and the gate line.

3. The method of claim 1, wherein the oxide channel layer is formed from indium gallium zinc oxide IGZO.

4. The method of claim 1, wherein the formation of the insulating etches stopper and the step coverage compensation patterns includes:
   sequentially forming an insulation layer and a photo resist film on the substrate with the oxide channel layer;
   patterning the photo resist film into a first photo resist pattern and second photo resist patterns using one of a half-tone mask and a diffractive mask;
   performing a first etch process, which uses the first and second photo resist patterns as etch masks, for the insulation layer to form a first insulation layer pattern on the oxide channel layer together with second insulation layer patterns in the overlapping regions of the gate electrode and the source and drain electrodes which will be formed through the following process;
   performing a first ashing process for the first and second photo resist patterns to expose the first insulation layer pattern, and remaining a third photo resist pattern on the second insulation layer pattern;
   performing a second etch process for the exposed first insulation layer pattern to form the insulating etch stopper; and
   performing a second ashing process for the third photo resist pattern to expose the second insulation layer pattern to form the step coverage compensation patterns,
   wherein the insulating etch stopper and the step coverage compensation patterns are in different thicknesses.

5. The method of claim 4, wherein the step coverage compensation pattern is thicker than the insulating etch stopper.

6. The method of claim 5, wherein the step coverage compensation pattern is in a thickness range of about 1200~1600 Å.

* * * * *